United States Patent [19]
Chiu et al.

[11] Patent Number: 5,412,499
[45] Date of Patent: May 2, 1995

[54] SPATIAL LIGHT MODULATOR USING QUANTUM WELL MATERIAL

[75] Inventors: Tien-Heng Chiu, Spotswood; Alastair M. Glass, Rumson; Afshin Partovi, Edison, all of N.J.

[73] Assignee: AT&T Corp., Murray Hill, N.J.

[21] Appl. No.: 38,405

[22] Filed: Mar. 29, 1993

[51] Int. Cl.⁶ .................. H01L 27/14; H01L 29/205; G02F 1/01
[52] U.S. Cl. ..................... 359/248; 359/245; 257/184; 257/656
[58] Field of Search ............... 359/248, 245; 257/184, 257/656

[56] References Cited

U.S. PATENT DOCUMENTS

| | | | |
|---|---|---|---|
| Re. 32,893 | 3/1989 | Miller | 250/211 J |
| 4,525,687 | 6/1985 | Chemla et al. | 332/7.51 |
| 5,004,325 | 4/1991 | Glass et al. | 350/354 |
| 5,115,335 | 5/1992 | Soref | 359/248 |

OTHER PUBLICATIONS

A. Partovi et al., "High sensitivity optical image processing device based on CdZnTe/ZnTe multiple quantum well structures," Appl. Phys. Lett. 59, 1991, 1832-1834.
A. Partovi et al., "High-speed photodiffractive effect in semi-insulating CdZnTe/ZnTe multiple quantum wells," Appl. Phys. Lett. 58, 1991, 334-336.
A. J. Moseley et al., "High Performance Hybrid Optoelectronic Terminal Components for Optical Interconnect," LEOS 1992 Summer Topical Meeting Digest on Smart Pixels (Santa Barbara, California, Aug. 10-12, 1992, IEEE, New York, 1992, pp. 20-21.
B. Mansoorian et al., "Design and Implementation of Flip-Chip Bonded Si/PLZT Smart Pixels," LEOS 1992 Summer Topical Meeting Digest on Smart Pixels, Santa Barbara, California, Aug. 10-12, 1992, IEEE, New York, 1992, 22-23.

Primary Examiner—Do Hyun Yoo
Attorney, Agent, or Firm—Martin I. Finston

[57] ABSTRACT

A spatial light modulator includes a multiple quantum well (MQW) device. Unlike MQWs of the prior art, this MQW is made semi-insulating. As a result, individual picture elements can be defined entirely by the placement of electrodes in an array on a surface of the device. Them is no need to etch trenches for electrical isolation of the picture elements.

13 Claims, 1 Drawing Sheet

SPATIAL LIGHT MODULATOR USING QUANTUM WELL MATERIAL

FIELD OF THE INVENTION

The invention relates to electrically addressed optical modulators, and more particularly, to those modulators that use the non-linear optical properties of multiple quantum well structures.

ART BACKGROUND

As the field of image processing continues to advance, there is an increasing demand for spatial light modulators (SLMS) that can impress a two-dimensional pattern on a beam of light at high speed and high resolution. Although liquid crystal SLMs have been known for many years, these devices are too slow for some modern applications. A faster alternative to the liquid crystal SLM is a solid state SLM in which a multiple quantum well (MQW) is included in the intrinsic region of a p-i-n diode structure. The use of structures of this kind for light modulation is described, for example, in U.S. Pat. No. 4,525,687, issued to D. S. Chemla et al. on Jun. 25, 1985, and in U.S. Pat. No. Re. No. 32,893, reissued to D. A. B. Miller on Mar. 21, 1989.

In order to achieve high resolution without incurring prohibitive manufacturing costs, it is desirable to fabricate these SLMs as monolithic devices. Because the p-i-n structure is semiconductive, it is necessary to include in the manufacturing process lithographic patterning and etching steps that isolate each picture element in a discrete mesa. Elimination of these steps would result in reduced manufacturing costs.

SUMMARY OF THE INVENTION

We have found that a useful SLM can be made using a MQW structure that is semi-insulating. (In this regard, a material is considered to be "semi-insulating" if it has a resistivity of about $10^3$–$10^8$ Ω-cm.) Because such a structure is much less conductive than a conventional MQW structure, there is adequate electrical isolation between adjacent picture elements even without etching the structure to form mesas.

Accordingly, the invention, in a broad sense, is an optical modulator that includes an integral, slab-like, optical medium that comprises a MQW. The medium is subdivided into picture elements. An array of electrodes, each corresponding to a respective picture element, is formed on a principal surface of the medium. The modulator further includes an electronic driver circuit for applying a separately controllable voltage to each of the electrodes. Applying this voltage changes the optical absorption or refractive index of the corresponding picture element, relative to at least one wavelength of light to be modulated. (The term "light" in this context is intended to include invisible wavelengths of electromagnetic radiation, such as infrared and ultraviolet radiation.) In contrast to modulators of the prior art, the medium is semi-insulating, and at least two electrodes are formed on a portion of the principal surface that is continuous and planar.

DETAILED DESCRIPTION OF A PREFERRED EMBODIMENT

Figure 1:
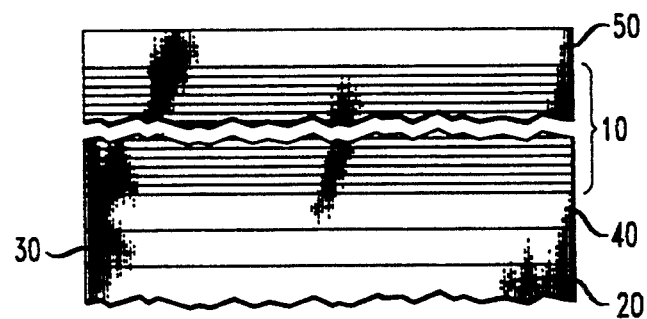
FIG. 1 is a schematic, sectional view of a semi-insulating, multiple quantum well (SI-MQW) device that is included in a spatial light modulator according to one embodiment of the invention.

As noted, the inventive modulator uses the non-linear optical properties of a semi-insulating multiple quantum well (SI-MQW) device. Devices of this kind are described generally in U.S. Pat. No. 5,004,325, issued to A. M. Glass et al. on Apr. 2, 1991. By way of illustration, we now briefly describe, with reference to FIG. 1, a SI-MQW device that we have used successfully in experimental trials. This device comprises a MQW structure 10 having, e.g., 75 periods, each consisting of a 10-nm GaAs quantum well layer and a 3.5-nm $Al_{0.29}Ga_{0.71}As$ barrier layer grown by molecular beam epitaxy (MBE) at 630° C. on a GaAs substrate 20. The entire periodic structure is made semi-insulating by doping it with, e.g., $10^{16}$ cm$^{-3}$ of chromium.

Before the quantum well layers are deposited, a 100 Å layer 30 of AlAs is optionally deposited, and then a 500 Å layer 40 of chromium-doped GaAs is optionally deposited. Because hydrofluoric acid etches AlAs more rapidly than GaAs, the AlAs layer is useful as a sacrificial layer for releasing the MQW structure from the substrate upon exposure to an HF etchant solution. The 500 Å GaAs layer is useful as a buffer layer to protect the MQW structure from the etchant.

After the quantum well layers are deposited, it is desirable to deposit a GaAs layer 50 to serve as a common electrode for the entire MQW device. The common electrode must be at least partially transparent to the light that is to be modulated. An exemplary such layer is a 1000 Å layer of GaAs doped n-type with silicon.

It should be noted in this regard that the SI-MQW device is not necessarily based on a III–V material system. For example, SI-MQW devices based on II–VI material systems are described in A. Partovi et al., "High sensitivity optical image processing device based on CdZnTe/ZnTe multiple quantum well structures," *Appl. Phys. Lett.* 59 (1991) 1832–1834, in A. Partovi et al., "High-speed photodiffractive effect in semi-insulating CdZnTe/ZnTe multiple quantum wells," *Opt. Lett.* 17 (1992) 655–657, and in A. Partovi et al., "Electroabsorption in II–VI multiple quantum wells," *Appl. Phys. Lett.* 58 (1991) 334–336. These devices are typically made semi-insulating by ion-implanting them with protons.

In use, an electrical potential of 5–20 V is typically applied across the SI-MQW device, or one or more selected portions of the device. (In at least some cases, applied voltages as small as 1 V or less will also be effective.) As a result of the quantum confined Stark effect, this electrical potential causes large changes in the optical absorption and refractive index of the medium near the exciton absorption peak. (In the illustrative III–V device described above, this peak occurs at 850 nm.) These changes make the SI-MQW device useful as a SLM.

For example, we have applied a potential of 20 V across a 150-period device similar in all other respects to the illustrative 75-period SI-MQW device described above. In response, we have observed an absorption change $\Delta\alpha$ of about 7500 cm$^{-1}$ and a refractive index change $\Delta n$ of about 0.06.

Figure 2:
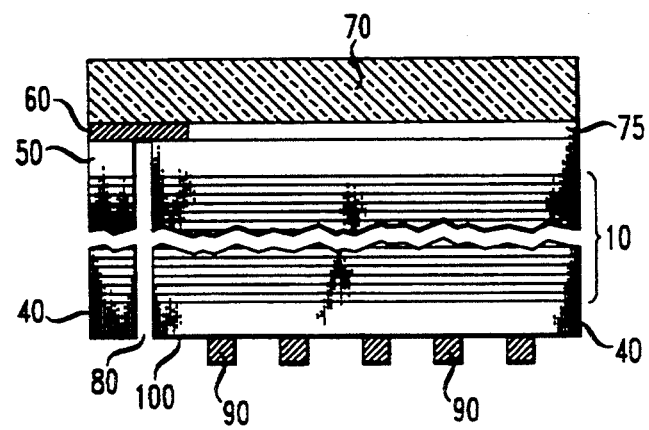
FIG. 2 is a schematic, sectional view of the SI-MQW device of FIG. 1, further including a transparent window and metal electrodes.

As noted, the illustrative SI-MQW device described above has a common electrode 50 of n-type GaAs. As shown in FIG. 2, electrical connections to this electrode are facilitated by depositing a metal contact layer 60 over a portion of common electrode 50. For convenience in handling the SI-MQW device, the face of this electrode, including the metal contact layer, may be affixed to the back side of a window 70 that is transparent to the light that is to be modulated. The window is affixed by, e.g., a layer 75 of epoxy cement. A portion of the metal contact layer is made accessible from the back of the device (i.e., the side opposite to the window) by etching a hole 80 through the device.

For applying separately controllable voltages (relative to the common electrode) to individual picture elements, an array of metal electrodes 90, to be referred to as "pixel electrodes," is deposited on back face 100 of buffer layer 40, i.e., the face exposed by removal of the sacrificial AlAs layer and the substrate. (If layer 40 is omitted, these electrodes can be deposited directly on the back face of the MQW structure.) Each electrode of this array corresponds to one picture element. Because doping with chromium makes the GaAs layer and the MQW structure semi-insulating, adequate electrical isolation is achieved between neighboring picture elements simply by appropriately spacing out the pixel electrodes. For example, we believe that in a SI-MQW device 1 μm thick, picture elements 1 μm square will be adequately isolated by an edge-to-edge interelectrode spacing as small as 1 μm. Thus, there is no need to etch isolation trenches between the picture elements. Instead, some or all of the pixel electrodes can occupy a portion of the back face that is continuous and planar.

By way of example, a typical modulator will have a 128×128 array of pixel electrodes, each 50 μm square, at a pitch of 60 μm. Thus, the interelectrode separation will be 10 μm. More generally, we believe that M×N arrays of picture elements are attainable in which M and N have integer values of 100 or more, and the picture elements have a pitch of 100 μm or less, and even as small as 10 μm or less.

Figure 3:
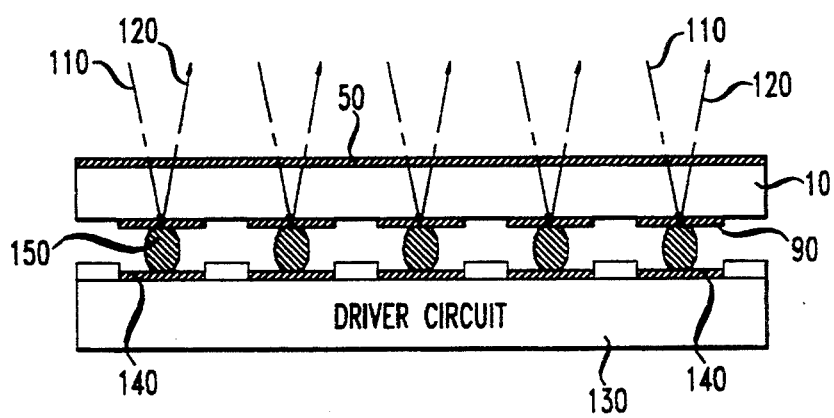
FIG. 3 is a schematic, sectional view of an illustrative optical modulator that includes the SI-MQW device of FIG. 2, and further includes a driver circuit to be connected by flip-chip attachment.

Turning now to FIG. 3, the light 110 that is to be modulated enters the SI-MQW device through the common electrode. After passing through the device, this light is reflected from, e.g., the pixel electrode array. Thus, the modulated light 120 exits the device after making a double pass through the device.

The inventive modulator includes an electronic circuit 130 for controlling the application of the respective voltages to the picture elements. For example, silicon integrated circuits (ICs) appropriate for driving optical modulator or detector elements are well known. For compact packaging, it is advantageous to combine the SI-MQW device and an integrated driver circuit in a hybrid, optoelectronic integrated circuit. This can be done, for example, by flip-chip attachment of the SI-MQW device to a silicon IC having on its face an array of metal contact pads 140 (to be referred to as "driver electrodes") that match the array of pixel electrodes 90 of the SI-MQW device. Hybrid circuits assembled by methods of this kind are described, for example, in A. J. Moseley et al., "High Performance Hybrid Optoelectronic Terminal Components for Optical Interconnect," *LEOS* 1992 *Summer Topical Meeting Digest on Smart Pixels* (Santa Barbara, Calif., Aug. 10–12, 1992), IEEE, New York (1992) pp. 20–21, and in B. Mansoorian et al., "Design and Implementation of Flip-Chip Bonded Si/PLZT Smart Pixels," *LEOS* 1992 *Summer Topical Meeting Digest on Smart Pixels* (Santa Barbara, Calif., August 10–12, 1992), IEEE, New York (1992) pp. 22–23.

Figure 4:
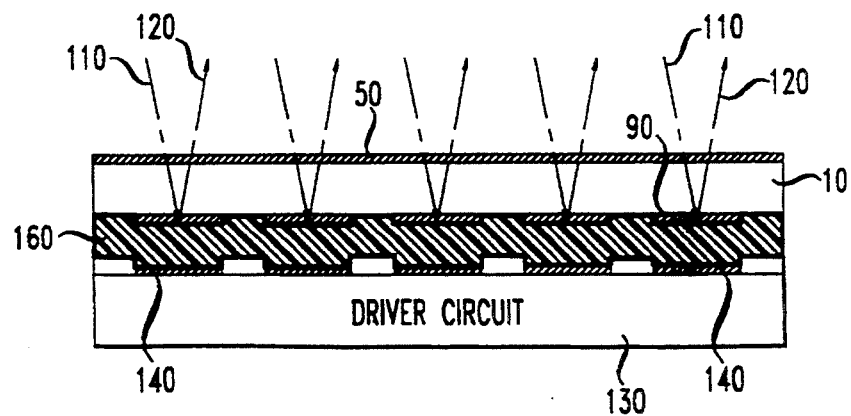
FIG. 4 is a schematic, sectional view of an illustrative optical modulator that includes the SI-MQW device of FIG. 2, and further includes a driver circuit connected through a conductive polymeric pad.

In flip-chip attachment, the surface tension in a layer of reflowed solder bumps 150 brings the facing electrode arrays into alignment. Other methods of attachment can also be used. For example, with reference to FIG. 4, electrical connection between the facing electrode arrays can be made through a compressible pad of electrically conductive, polymeric material 160. One type of material useful for this purpose is elastomeric material adapted to conduct electricity preferentially in the direction perpendicular to its principal surfaces. These materials are commercially available from several vendors. One such material is Elastomeric Conductive Polymer Interconnect (ECPI), sold by AT&T Microelectronics of Allentown, Pa.

In fact, we believe that adequate electrical isolation between picture elements can be maintained even if the pad of conductive, polymeric material has no preferential direction for conducting electricity. One useful measure of electrical isolation, in this regard, can be defined with reference to the voltage drop produced across the SI-MQW device when an activating voltage is applied to a given driver electrode. Isolation will be regarded as adequate if, for example, the voltage drop across the SI-MQW region corresponding to the activated picture element is at least ten times the voltage drop across neighboring picture-element regions. This is readily achieved by an appropriate combination of electrode size, electrode spacing, and thickness and conductivity of the polymeric pad. For example, we have estimated that the voltage drop across the activated region will be about 19 times the voltage drop across neighboring regions if the SI-MQW device has a resistivity of $10^6$ Ω-cm, the polymeric pad has a resistivity of $10^5$ Ω-cm, the polymeric pad is 1 μm thick, each electrode is 40 μm square, and the electrodes have an edge-to-edge spacing of 20 μm.

In an alternate embodiment, the MQW structure is an asymmetric, coupled, quantum well structure, instead of the symmetric structure described above. For example, we have made a structure that consists of 59 periods of four layers each, enclosed between the above-described common electrode layer on one side, and the above-described sacrificial and buffer layers on the other side. Within each period, the four layers, beginning with the layer nearest the substrate, are 58 Å GaAs, 14 Å Al$_{0.3}$Ga$_{0.7}$As, 63 Å GaAs, and 35 Å Al$_{0.3}$Ga$_{0.7}$As. The entire structure is made semi-insulating by doping it with chromium. We currently prefer this structure because in experimental tests, it appears to give a higher contrast ratio than the symmetric structure described earlier.

We claim:

1. An optical modulator, comprising:
   a) an integral, slab-like, optical medium that comprises a multiple quantum well structure (to be referred to as a "MQW" structure) and is subdivided into a plurality of picture elements;

b) an array of pixel electrodes formed on a principal surface of the medium, each of said electrodes corresponding to a respective picture element; and c) an electronic driver circuit for applying a separately controllable voltage to each of the pixel electrodes such that the optical absorption or refractive index of the corresponding picture element is changed relative to at least one wavelength of light to be modulated, characterized in that d) the medium is semi-insulating;

e) at least two of the pixel electrodes are formed on a portion of the principal surface that is continuous, planar, and uniformly doped;

f) the array of pixel electrodes has a pitch of 100 μm or less; and g) each picture element forms a semiconductor-metal junction with its respective pixel electrode.

2. The optical modulator of claim 1, wherein the MQW structure comprises III-V material that has been made semi-insulating by doping it with chromium.

3. The optical modulator of claim 1, wherein the MQW structure comprises II-VI material that has been made semi-insulating by implanting it with protons.

4. The optical modulator of claim 1, wherein:

a) the optical medium further comprises a common electrode layer contactingly overlying the MQW structure such that the MQW structure is interposed between said common electrode layer and the array of pixel electrodes;

b) the common electrode layer is at least partially transparent to the wavelength of light to be modulated; and c) the common electrode layer overlies at least some of the pixel electrodes.

5. The optical modulator of claim 4, wherein the MQW structure comprises III-V material, and the common electrode layer comprises semiconductive III-V material.

6. The optical modulator of claim 4, wherein the MQW structure comprises II-VI material, and the common electrode layer comprises semiconductive II-VI material.

7. The optical modulator of claim 1, wherein the electronic driver circuit comprises an array of driver electrodes, and each pixel electrode is aligned with and electrically connected to a corresponding driver electrode.

8. The optical modulator of claim 7, further comprising a layer of electrically conductive polymeric material interposed between the pixel electrode array and the driver electrode array such that each pixel electrode is electrically connected through the polymeric layer to a corresponding driver electrode.

9. The optical modulator of claim 7, wherein each pixel electrode is soldered directly to the corresponding driver electrode.

10. The optical modulator of claim 1, wherein the pixel electrodes are formed directly on a surface of the MQW structure.

11. The optical modulator of claim 1, further comprising a semi-insulating layer adjacent and contacting the MQW structure, wherein the pixel electrodes are formed directly on a surface of the semi-insulating layer.

12. The optical modulator of claim 1, wherein the array of pixel electrodes is an M×N array and M and N are integers equal to 100 or more.

13. The optical modulator of claim 12, wherein the array of pixel electrodes has a pitch of 10 μm or less.

* * * * *